(12) United States Patent
Pieh et al.

(10) Patent No.: US 7,994,498 B2
(45) Date of Patent: Aug. 9, 2011

(54) WHITE ORGANIC LIGHT EMITTING DEVICE AND METHOD FOR MANUFACTURING THE SAME

(75) Inventors: Sung-Hoon Pieh, Seoul (KR); Chang-Je Sung, Gyeonggi-do (KR); Jeong-Dae Seo, Incheon (KR); Sang-Kyoon Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/615,577

(22) Filed: Nov. 10, 2009

(65) Prior Publication Data

US 2010/0133522 A1    Jun. 3, 2010

(30) Foreign Application Priority Data

Dec. 1, 2008  (KR) .................. 10-2008-0120626

(51) Int. Cl.
*H01L 33/00* (2010.01)

(52) U.S. Cl. .......................................... 257/40; 257/79

(58) Field of Classification Search .................. 257/40, 257/79
See application file for complete search history.

(56) References Cited

U.S. PATENT DOCUMENTS

2008/0297036 A1* 12/2008 Noh et al. .................. 313/504
* cited by examiner

*Primary Examiner* — Long Pham
(74) *Attorney, Agent, or Firm* — Morgan, Lewis & Bockius LLP

(57) ABSTRACT

The present invention relates to a white organic light emitting device and a method for manufacturing the same, in which a hole transport layer is made to have an energy level higher than an energy level of an excited state of a phosphorescent light emitting layer adjacent thereto for enhancing light emitting efficiency of the hole transport layer without an additional exciton blocking layer, and a dopant content in the phosphorescent light emitting layer is adjusted for preventing color shift from taking place.

The white organic light emitting device includes an anode and a cathode placed on a substrate opposite to each other, a charge generation layer formed between the anode and the cathode, a first stack of a first hole transport layer, a first light emitting layer for emitting a blue light, and a first electron transport layer between the anode and the charge generation layer, and a second stack of a second hole transport layer, a second light emitting layer having a host doped with phosphorescence red and green together, and a second electron transport layer between the charge generation layer and the cathode, wherein the second hole transport layer has an energy level set higher than a triplet excited state energy level of the second light emitting layer.

5 Claims, 11 Drawing Sheets

WHITE ORGANIC LIGHT EMITTING DEVICE AND METHOD FOR MANUFACTURING THE SAME

CROSS REFERENCE TO RELATED APPLICATION

This application claims the benefit of the Patent Korean Application No. 10-2008-0120626, filed on Dec. 1, 2008, which is hereby incorporated by reference as if fully set forth herein.

BACKGROUND OF THE DISCLOSURE

1. Field of the Disclosure

The present invention relates to organic light emitting devices, and, more particularly, to a white organic light emitting device and a method for manufacturing the same, in which a hole transport layer is made to have an energy level higher than an energy level of an excited state of a phosphorescent light emitting layer adjacent thereto for enhancing light emitting efficiency of the hole transport layer without an additional exciton blocking layer, and a dopant content in the phosphorescent light emitting layer is adjusted for preventing color shift from taking place.

2. Discussion of the Related Art

Currently, as an information oriented age has come fully, a field of display which expresses an electric information signal visually has been developed at a high speed, and to meet this development, a variety of flat display devices which have excellent features of thin, light and low power consumption have been developed, and are replacing the present cathode ray tube CRT rapidly.

As specific examples of the flat display devices, there are a liquid crystal display devices LCD, a plasma display panel device PDP, a field emission display device FED, and an organic light emitting device OLED.

Of the flat display devices, the organic light emitting device OLED is considered as a competitive application since the organic light emitting device OLED requires no separate light source, is easy to make the device compact, and can display colors, clearly.

The organic light emitting device OLED requires an organic light emitting layer essentially, formed, in the related art, by deposition with a shadow mask.

However, since the shadow mask sags due to gravity if the shadow mask is large, is difficult to use many times, and has defects occurred in organic light emitting layer formation, alternatives have been required.

As one of many methods suggested for replacing the shadow mask, there is the white organic light emitting device.

The white organic light emitting device will be described.

The white organic light emitting device has layers between an anode and a cathode deposited without masks in formation of a light emitting diode, wherein organic films including an organic light emitting layer are deposited in a vacuum in succession with materials varied from one another.

The white organic light emitting device has many applications, such as a thin light source, a back light unit in the liquid crystal display device, or a full color display device having a color filter applied thereto, and so on.

The white organic light emitting device may have a plurality of light emitting layers having color different from one another by applying dopants of different colors to the light emitting layers respectively. However, there is limitations of composition of the dopants contained in the light emitting layers due to the properties of the dopants themselves, and, since mix of the light emitting layers is focused on production of a white light, to have a white wavelength characteristic that has a uniform peak value at a white wavelength region other than red, green, and blue wavelength regions, a color reproduction ratio becomes poor when the color filter is included to the white organic light emitting device. Moreover, since materials of the dopants are different from one another, if the white organic light emitting device is used continuously, color shift takes place.

Moreover, since energy levels of the light emitting layer and the hole transport layer similar at an interface thereof, triplet exciton passes through the interface to immigrate to the hole transport layer, dropping the light emitting efficiency in an excited state, and, if an exciton blocking layer EBL is provided for preventing this from taking place, a driving voltage rises, process steps are increased and a lifetime is shortened, imposing many obstacles in producing the white organic light emitting device of an optimum efficiency.

SUMMARY OF THE DISCLOSURE

Accordingly, the present invention is directed to a white organic light emitting device and a method for manufacturing the same.

An object of the present invention is to provide a white organic light emitting device and a method for manufacturing the same, in which a hole transport layer is made to have an energy level higher than an energy level of an excited state of a phosphorescent light emitting layer adjacent thereto for enhancing light emitting efficiency of the hole transport layer without an additional exciton blocking layer, and a dopant content in the phosphorescent light emitting layer is adjusted for preventing color shift from taking place.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a white organic light emitting device includes an anode and a cathode placed on a substrate opposite to each other, a charge generation layer formed between the anode and the cathode, a first stack of a first hole transport layer, a first light emitting layer for emitting a blue light, and a first electron transport layer between the anode and the charge generation layer, and a second stack of a second hole transport layer, a second light emitting layer having a host doped with phosphorescence red and green dopants together, and a second electron transport layer between the charge generation layer and the cathode, wherein the second hole transport layer has an energy level set higher than a triplet excited state energy level of the second light emitting layer.

The second transport layer has an energy level set 0.01~0.4 eV higher than the triplet excited state energy level of the second light emitting layer.

For an example, the second hole transport layer is formed of a compound with a chemical formula 1 shown below having an asymmetric structure.

Chemical Formula 1

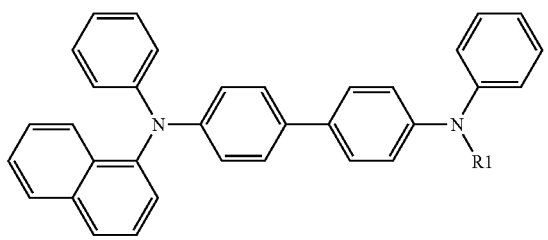

Wherein R1 is selected from a substituted or non-substituted aromatic group or a heterocyclic group.

In detail, the R1 may be selected from a substituted or non-substituted phenyl, pyridine, naphthalene, quinoline and carbazole.

The host of the second light emitting layer is selected from materials having a high energy transfer ratio to the green dopant, and the red dopant is selected from materials having a high energy transfer ratio from the green dopant and a lifetime similar to the green dopant, so that brightness is reduced to the same level throughout an entire wavelengths without color variation even if time passes, so as to be suitable to display a white color.

In another aspect of the present invention, a method for manufacturing a white organic light emitting device comprising the steps of forming an anode on a substrate, forming a first stack by stacking a first hole transport layer, a first light emitting layer for emitting a blue light, and a first electron transport layer on the substrate including the anode in succession, forming a charge generation layer on the first stack, forming a second stack by stacking a second hole transport layer, a second light emitting layer having a host doped with phosphorescence red and green dopants together, and a second electron transport layer on the charge generation layer in succession, and forming a cathode on the second stack, wherein the second hole transport layer has an energy level set higher than a triplet excited state energy level of the second light emitting layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
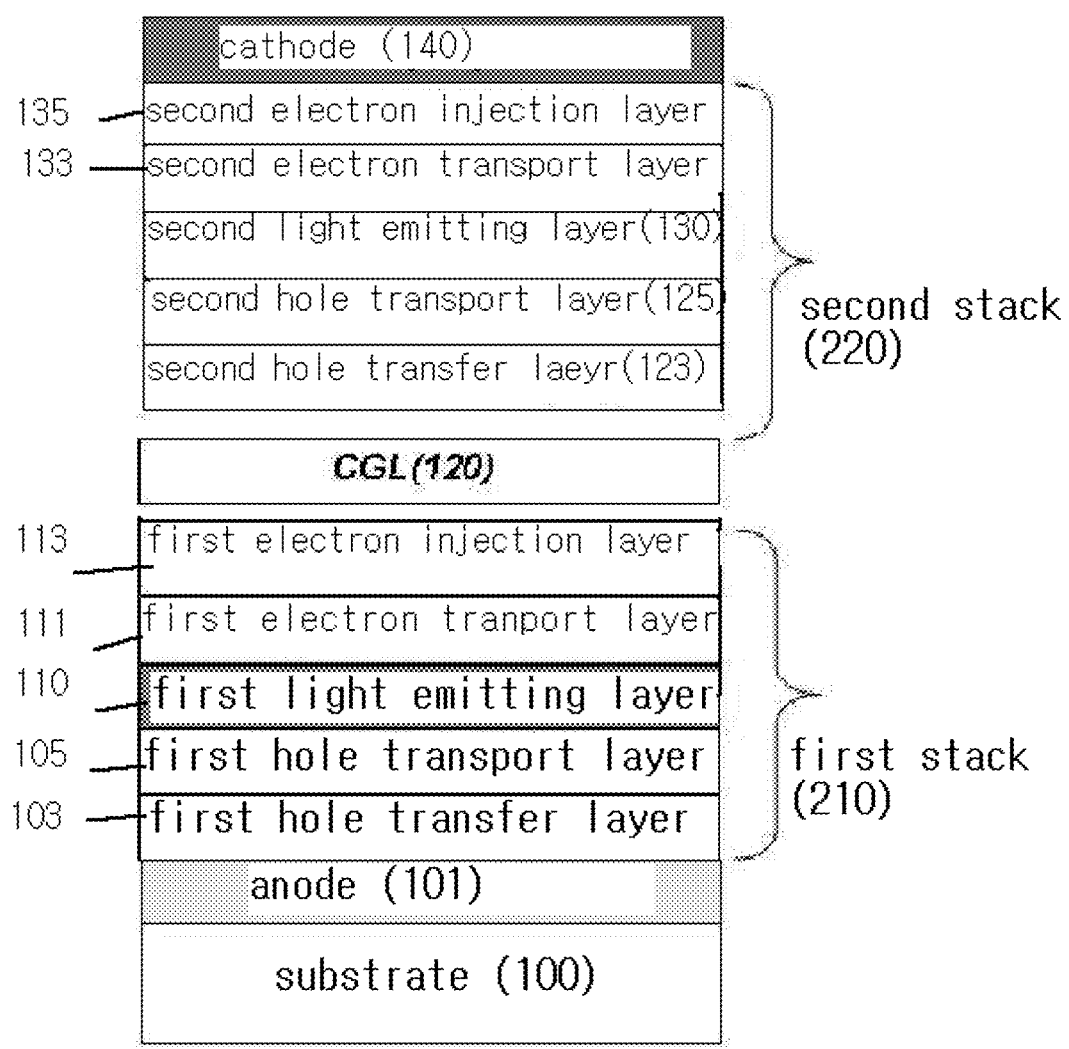
FIG. 1 illustrates a section of a white organic light emitting device in accordance with a preferred embodiment of the present invention, schematically.

FIG. 1 illustrates a section of a white organic light emitting device in accordance with a preferred embodiment of the present invention, schematically.

Referring to FIG. 1, the white organic light emitting device includes opposite anode 101 and cathode 140 on a substrate 100, a first stack 210 between the anode 101 and the cathode 140, a charge generation layer 120 and a second stack 220.

The anode 101 is formed of a transport electrode, such as ITO (Indium Tin Oxide), and the cathode 140 is formed of a reflective metal, such as Al. Owing to respective light emission from the first and second stacks 210 and 220 arranged as above, an image is forwarded to a lower side of the drawing.

The first stack 210 includes a first hole injection layer HIL 103, a second hole transport layer HTL 105, a first light emitting layer 110, a first electron transport layer ETL 111, and a first electron injection layer EIL 113 stacked in succession between an upper side of the anode 101 and the charge generation layer 120, and the second stack 220 includes a second hole transfer layer 120, a second hole transport layer 125, a second light emitting layer 130, a second electron transport layer 133, and a second electron injection layer 135 stacked in succession between the charge generation layer 120 and the cathode 140.

The first light emitting layer 110 is a light emitting layer having a blue light host containing dopant having a blue fluorescent light constituent or a phosphorescent light constituent, and the second light emitting layer 110 is a single light emitting layer having a host doped with dopant of a phosphorescence green and a phosphorescence red.

In this case, the white color can be produced by a mixing effect of lights emitting from the first light emitting layer 110 and the second light emitting layer 130 when the white organic light emitting device is driven.

In this instance, the second hole transport layer 125 is set to have an energy level higher than an energy level of an exited state of a triplet exciton of the second light emitting layer 130. In this case, it is preferable that the second hole transport layer 125 is set to have an energy level 0.01~0.4 eV higher than an energy level of the exited state of a triplet exciton of the second light emitting layer 130. In this instance, since the second hole transport layer 125 have an energy level higher than an energy level the second light emitting layer 130, it can be prevented that the triplet exciton of the second light emitting layer 130 goes over to the second hole transport layer 125, thereby dropping light emitting efficiency. That is, in this instance, the second transport layer 125 serves to transport the hole from the second light emitting layer 130 which is a unique function of the second light emitting layer 130 as well as a exciton blocking layer which prevents the triplet exciton from coming over thereto.

A method for manufacturing a white organic light emitting device in accordance with a preferred embodiment of the present invention will be described with reference to FIG. 1.

Referring to FIG. 1, in the method for manufacturing a white organic light emitting device, an anode is formed on a substrate 100.

Then, a first hole transfer layer 103, a first hole transport layer 105, a first light emitting layer 110 for emitting a blue color, a first electron transport layer 111, and a first electron injection layer 113 are stacked on the substrate including the anode 101 in succession, to form a first stack 210.

Then, a charge generation layer 120 is formed on the first stack 210.

Then, a second hole transfer layer 123, a second hole transport layer 125, a second light emitting layer 130 having one host doped with dopant of a phosphorescence green and a phosphorescence red, a second electron transport layer 123 and a second electron injection layer 135 are stacked on the charge generation layer 120 in succession to form a second stack 220.

Then, a cathode 140 is formed on the second stack 220.

In this instance, a stage energy level of a triplet of the second hole transport layer 125 is set higher than an energy level of an excited state of the second light emitting layer 130.

An energy transfer mechanism of the white organic light emitting device of the present invention will be described.

Figure 2A:
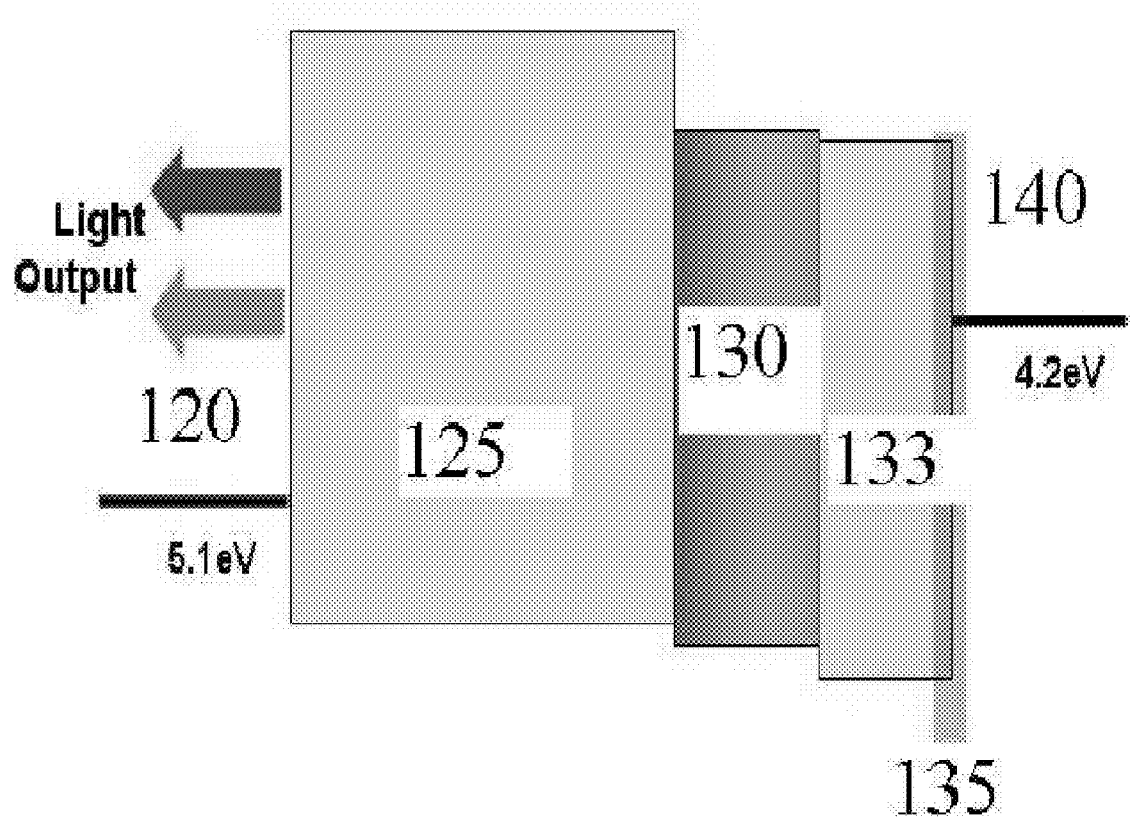
FIGS. 2a and 2b illustrate energy shifts at layers of second stacks of a white organic light emitting device of the present invention and a comparative structure, respectively.
Figure 2B:
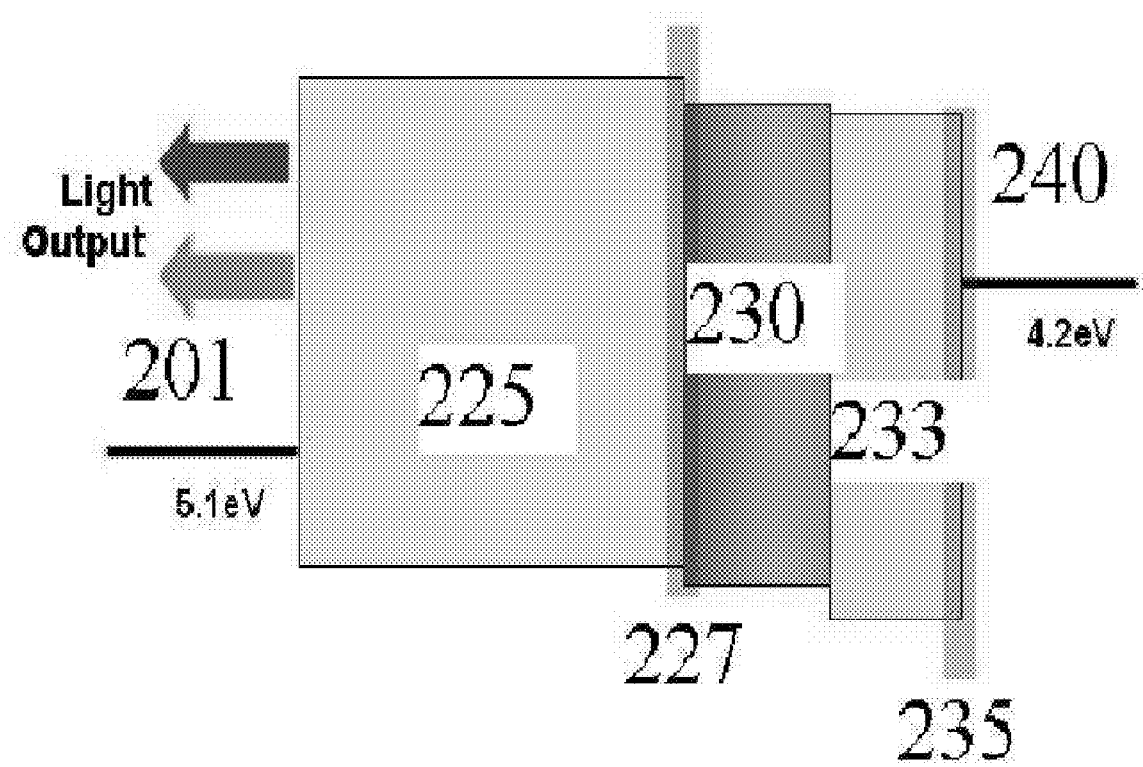

FIGS. 2a and 2b illustrate energy shifts at layers of second stacks of a white organic light emitting device of the present invention and a comparative structure, respectively.

FIG. 2a illustrates an energy level of the second hole transport layer 125 made higher than an exited state energy level of a triplet exciton of the second light emitting layer 130 like the second stack in FIG. 1, and FIG. 2b illustrates a structure having a TBL (triplet blocking layer) added thereto for preventing an exciton from being introduced to the hole transport layer 225 from the light emitting layer when energy levels of the light emitting layer 230 and the hole transport layer 225 adjacent thereto are similar to an excited state energy level of a triplet exciton of the light emitting layer 230.

Alike a structure of the present invention, in FIG. 2b, an electron transport layer 233 and an electron injection layer 235 are formed between the light emitting layer 230 and the cathode.

For comparison to FIG. 2b, in FIG. 2a, the first stack and the charge generation layer CGL 120 are omitted.

Figure 3A:
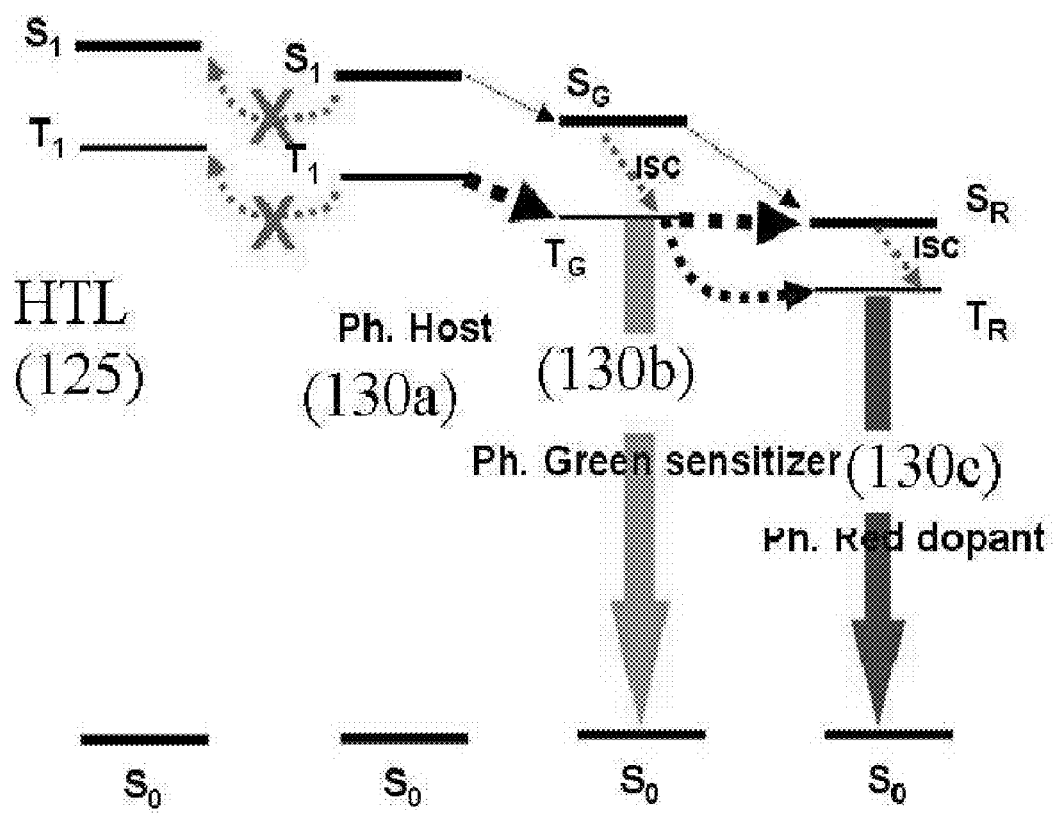
FIGS. 3a to 3c illustrate an energy transfer mechanism of a second stack of a white organic light emitting device of the present invention and energy transfer mechanisms of comparative structures, respectively.
Figure 3B:
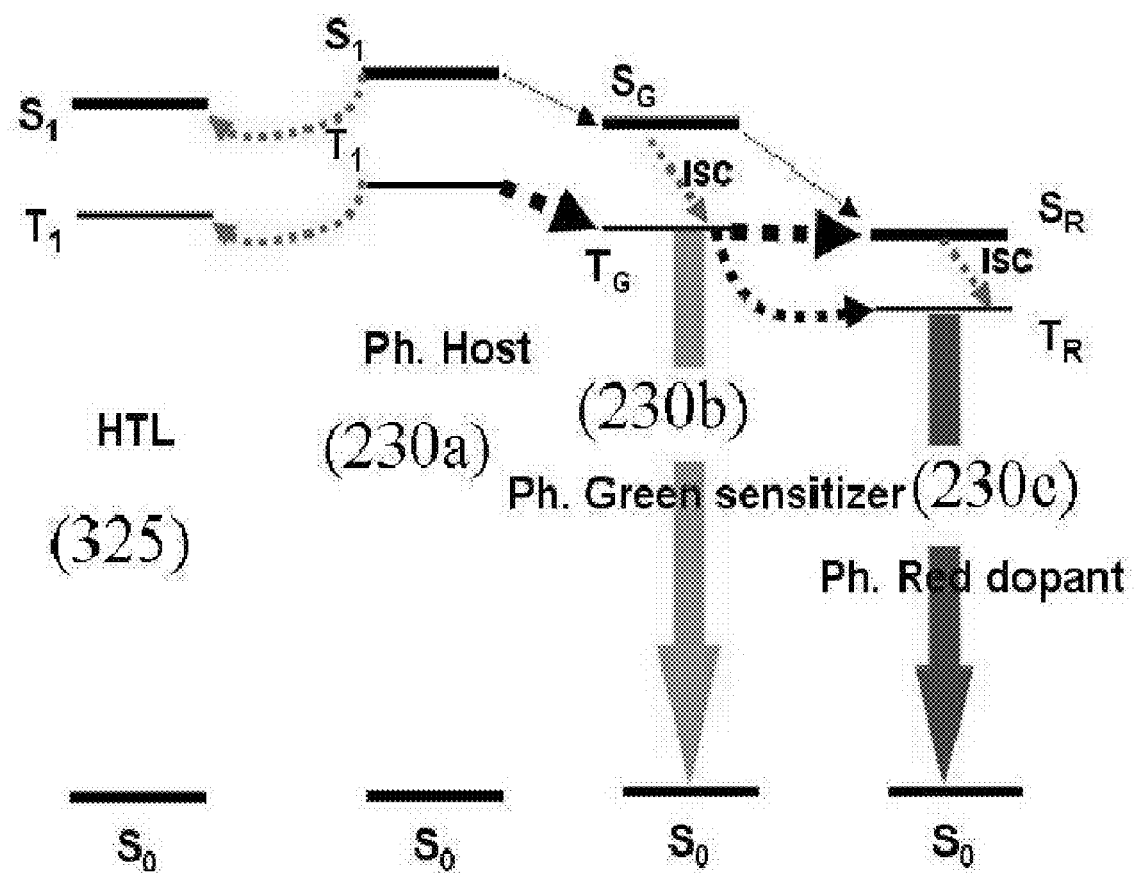
Figure 3C:
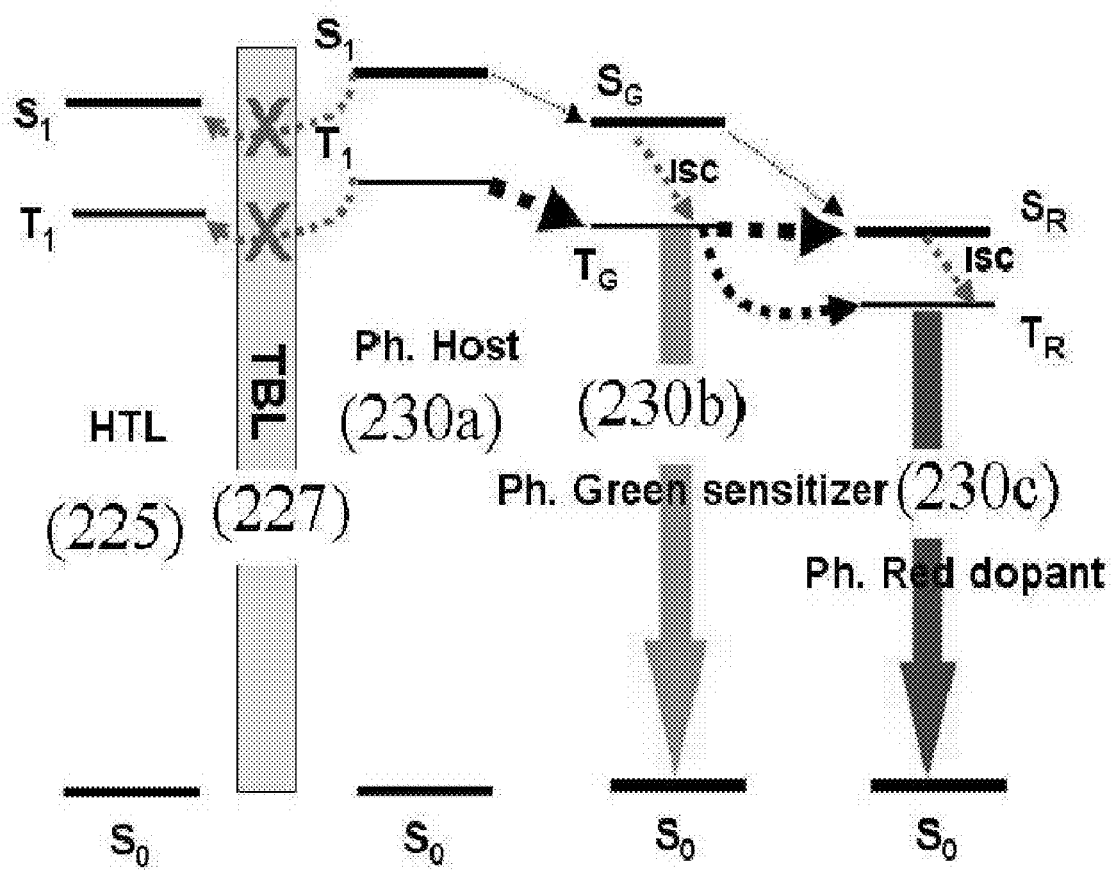

FIGS. 3a to 3c illustrate an energy transfer mechanism of a second stack of a white organic light emitting device of the present invention and energy transfer mechanisms of comparative structures, respectively.

FIG. 3a illustrates a case of a structure of the second stack of the present invention corresponding to FIG. 2a, FIG. 3b illustrates a case an exited state energy level of the light emitting layer and an energy level of the hole transport layer adjacent to the light emitting layer are similar, and FIG. 3c illustrates an energy mechanism between a light emitting layer and a hole transport layer in a case of a structure corresponding to FIG. 2b.

Referring to FIG. 3a, the second light emitting layer, which is a layer having a phosphorescent host material 130a with dopants of a phosphorescence green 130b and a phosphorescence red 130c contained therein, wherein, if the second light emitting layer is excited by supply of a current thereto, the phosphorescent host material is excited at first, and a singlet exciton S1, a triplet exciton T1, and singlet excitons S1 and triplet excitons T1 Sg, Tg, Sr, and Tr of the dopants of a phosphorescence green 130b and a phosphorescence red 130c are excited in succession, to emit a mixed light of a green light and a red light. In this instance, since the energy level of the second hole transport layer 125 is higher than the singlet and triplet excitons of the phosphorescent host material 130a, the singlet exciton or the triplet exciton of the phosphorescent host material 130a can not go over to the second hole transport layer 125, but remains in the light emitting layer to contribute to coupling of the hole and electron, thereby enhancing the light emitting efficiency.

In this case, a state energy level of the triplet of the second hole transport layer 125 is higher than the energy level of the triplet exciton of the host material 130a of the light emitting layer, has a good hole transport characteristic, and is set to have an energy level 0.01~0.4 eV higher than the energy level of the triplet excited state energy level of the second light emitting layer.

For an example, the second hole transport layer 125 is formed of a material having an asymmetric structure as shown in chemical formula 1 below.

Chemical Formula 1

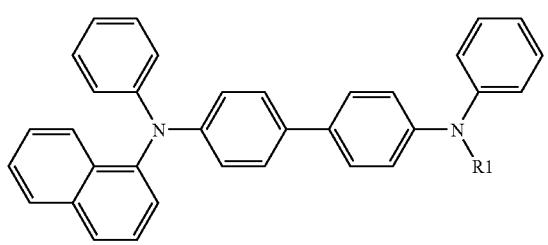

Wherein R1 is selected from a substituted or non-substituted aromatic group or a heterocyclic group.

In detail, the R1 may be selected from a substituted or non-substituted phenyl, pyridine, naphthalene, quinoline and carbazole.

Though FIG. 2b shows that the energy level of the hole transport layer 225 is higher than the excited state energy level of the light emitting layer, the energy level shows an average energy level when the host materials 230a, the dopants of a phosphorescence green 230b and a phosphorescence red 230c of the light emitting layer are combined. As shown in FIGS. 3b and 3c, if the energy level of each of the materials is reviewed, it can be known that the excited state energy level of the phosphorescent host material 230a is higher than the energy level of the hole transport layer 225. In this case, it can be known that, in FIG. 3b, the singlet exciton and the triplet exciton of the phosphorescent host material 230a are transferred to the hole transport layer 225, and, in this case, after an exciton constituent used for light emission escapes to the hole transport layer, the exciton constituent can not come back to the light emitting layer again. Consequently, the light emitting efficiency becomes the poorer as time passes by.

In order to prevent the singlet exciton and the triplet exciton shown in FIG. 3b from being injected into the hole injection layer 325, a triplet blocking layer 227 is provided between the light emitting layer 230 and the hole transport layer 225 in FIG. 3c for preventing the excitons from being injected from the light emitting layer 230 to the hole injection layer 225.

However, in a case of FIG. 3c, though escaping of the exciton to the hole transport layer 325 is prevented owing to the triplet blocking layer 227, a step is added for providing an additional layer and the artificial provision of one more material layer at an interface of the light emitting layer 230 raises a driving voltage. Therefore, it can be known that the white organic light emitting device of the present invention having a structure of FIG. 3a with the hole transport layer 125 which is made to have an energy level higher than an excited state of the light emitting layer is favorable in view of light emitting efficiency, process cost saving, prevention of power consumption increase, and a lifetime.

Figure 4:
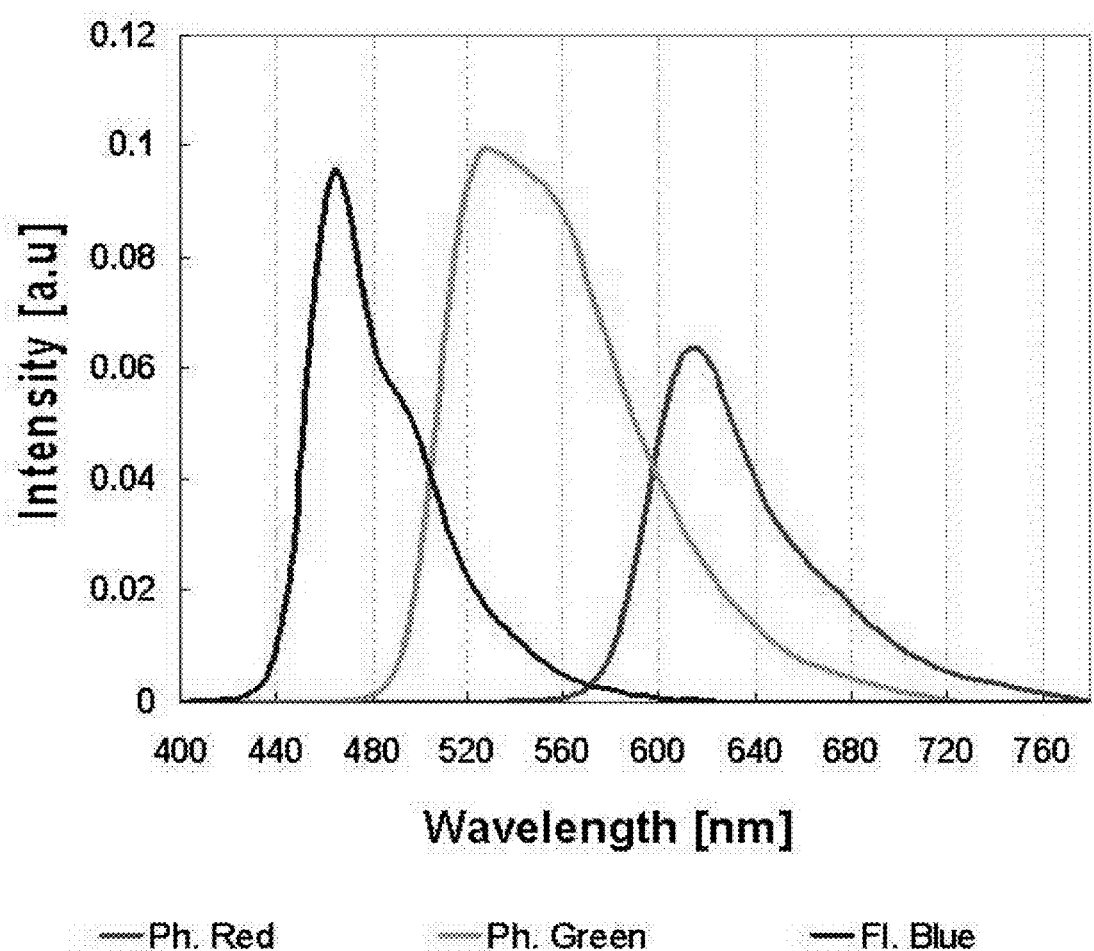
FIG. 4 illustrates a graph showing R, G, B wavelength characteristics when dopants of R, G, B are added to a host material.

FIG. 4 illustrates a graph showing R, G, B wavelength characteristics when dopants of R, G, B are added to a host material.

Referring to FIG. 4, the graph shows an intensity vs. a wavelength when, starting from left to right, B, G, R dopants are added to a host material respectively.

From the graph, it can be known that the intensity of the red wavelength is low. In the white organic light emitting device of the present invention, green dopant and red dopant are mixed together to work as the second light emitting layer, such that, after an excited state is made by the green dopant to emit a green light, since the singlet and triplet of the green light emission transfer an energy to the red dopant material, to increase the light emission efficiency higher than single red dopant introduction, the light emission efficiency of the red color increases when the red and green dopants are mixed.

Table 1 below shows a driving voltage and a brightness of a light. In this case, while the driving voltage is set to make a predetermined level of light emission efficiency for each color, in ranges of 3.6, 3.9, and 4.8V, the brightness, quantum efficiency QE and a CIE coordinate system are measured.

TABLE 1

| Structure | Volt (V) | Cd/A | lm/W | QE(%) | Cd/m2 | CIEx | CIEy |
|---|---|---|---|---|---|---|---|
| Red | 3.6 | 9.7 | 8.5 | 8.4% | 969 | 0.655 | 0.345 |
| Green | 3.9 | 47.1 | 37.7 | 15.2% | 4714 | 0.371 | 0.598 |
| Blue | 4.8 | 8.7 | 5.6 | 7.2% | 867 | 0.134 | 0.189 |

Figure 5:
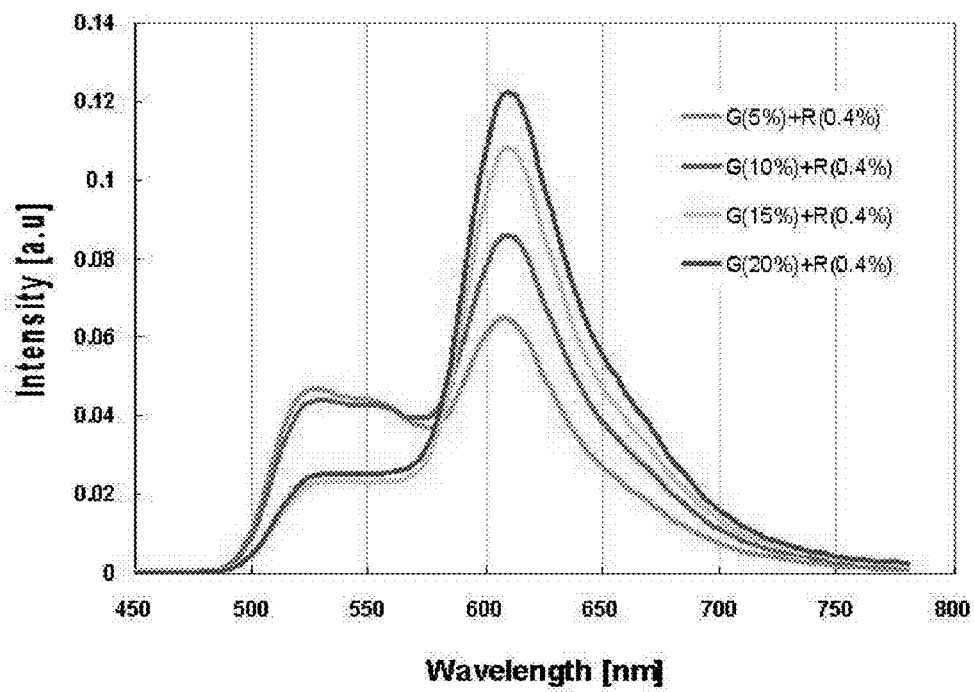
FIG. 5 illustrates a graph showing wavelength characteristics when a content of green dopant is varied in a case G and R dopants are added to a light emitting layer in a second stack of a white organic light emitting device of the present invention.

FIG. 5 illustrates a graph showing wavelength characteristics when a content of green dopant is varied in a case R and G dopants are added to a light emitting layer in a second stack of a white organic light emitting device of the present invention.

FIG. 5 illustrates a graph showing light emitting efficiency of a second stack when a content of red dopant is fixed to 0.4% and a content of green dopant is varied from 5% to 20% in fixed increments. In this case, as shown in table 2, while the driving voltages are maintained to almost the same range of 3.6~3.7V, the brightness, quantum efficiency QE and a CIE coordinate system are measured.

Referring to FIG. 5 and table 2, it can be known that red light emission efficiency is high if intensities of the green color and the red color are compared in a case the green dopant contents are higher than 15%. In this case, as described before, the introduction of the green dopant contributes not only to the green light emission, but also the red light emission efficiency as the singlet and triplet excitons of the green light transfer energy to the red dopant.

TABLE 2

| Structure | Volt (V) | Cd/A | lm/W | QE (%) | Cd/m2 | CIEx | CIEy |
|---|---|---|---|---|---|---|---|
| G(5%) + R(0.4%) | 3.6 | 30.0 | 26.3 | 13.5% | 2998 | 0.477 | 0.504 |
| G(10%) + R(0.4%) | 3.7 | 32.8 | 28.0 | 16.3% | 3278 | 0.507 | 0.478 |
| G(15%) + R(0.4%) | 3.6 | 27.8 | 24.1 | 16.6% | 2776 | 0.565 | 0.419 |
| G(20%) + R(0.4%) | 3.7 | 31.0 | 26.4 | 18.9% | 3099 | 0.572 | 0.420 |

Based on those tests, in following tests, cases when contents of the green dopant are below 10% are employed for making light efficiency of the green light and the red light uniform.

Figure 6:
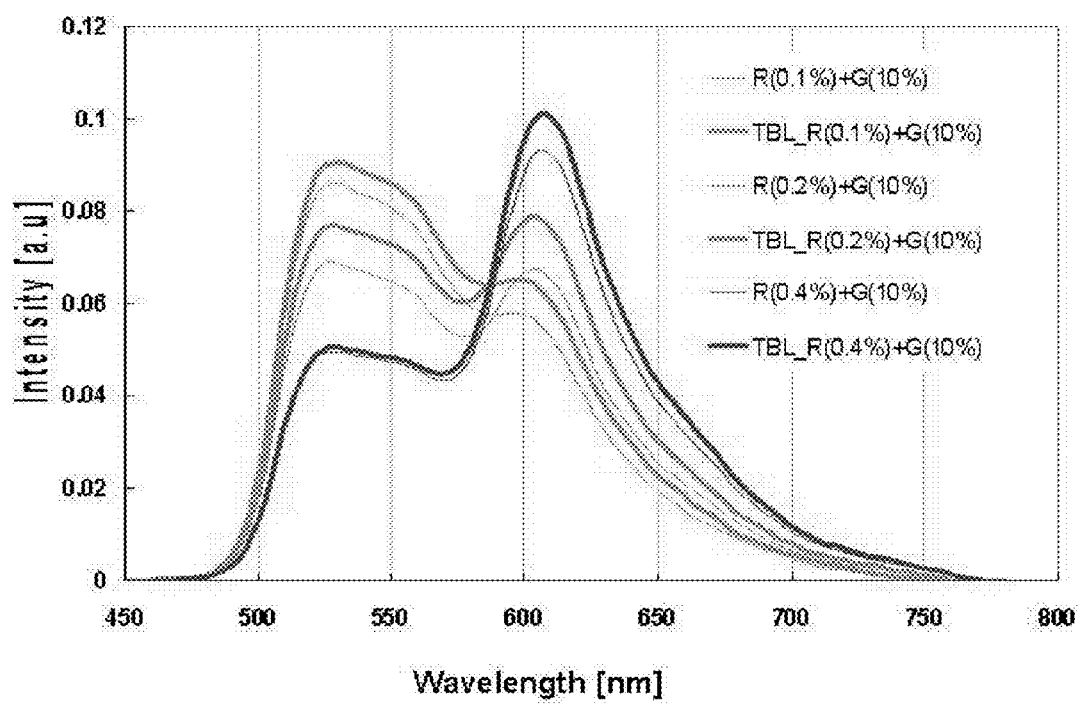
FIG. 6 illustrates a graph showing wavelength characteristics varied with applications of an exciton blocking layer and contents of red dopant in a case G and R dopants are added to a light emitting layer in a second stack of a white organic light emitting device of the present invention.

FIG. 6 illustrates a graph showing wavelength characteristics varied with applications of an exciton blocking layer and contents of red dopant in a case G and R dopants are added to a light emitting layer in a second stack of a white organic light emitting device of the present invention.

FIG. 6 illustrates a graph showing a wavelength vs. an intensity when applications of a triplet exciton blocking layer TBL and a content of red dopant are varied to 0.1%, 0.2%, and 0.4% while a content of green dopant is fixed to 10% in a second stack (red+green light emission).

TABLE 3

| Structure | Volt (V) | Cd/A | lm/W | QE (%) | Cd/m2 | CIEx | CIEy |
|---|---|---|---|---|---|---|---|
| G(10%) + R(0.1%) | 3.5 | 44.8 | 40.2 | 16.2% | 4483 | 0.411 | 0.562 |
| TBL_G(10%) + R(0.1%) | 3.7 | 48.5 | 40.8 | 17.8% | 4852 | 0.418 | 0.556 |
| G(10%) + R(0.2%) | 3.4 | 39.9 | 36.8 | 16.0% | 3988 | 0.445 | 0.532 |
| TBL_G(10%) + R(0.2%) | 3.6 | 45.5 | 39.7 | 18.4% | 4550 | 0.449 | 0.529 |
| G(10%) + R(0.4%) | 3.6 | 36.5 | 32.1 | 17.4% | 3652 | 0.501 | 0.482 |
| TBL_G(10%) + R(0.4%) | 3.8 | 38.3 | 31.6 | 18.5% | 3829 | 0.506 | 0.478 |

Referring to FIG. 6 and table 3, it can be noticed that the higher the content of the red dopant, the stronger the intensity of the red wavelength, and if the triplet blocking layer is applied, the intensity of the green light emission is high. The most preferable case is that the green color and the red color have the same or similar levels of light emission intensities. It can be noticed that the green color and the red color have similar levels of light emission intensities when around 0.2% of the red dopant is introduced.

Owing to above test, it can be determined that contents of the red color and the green color in the second stack are set to 0.2% and 10%.

In the meantime, implication of the addition of the dopant to the white organic light emitting device will be described.

Figure 7:
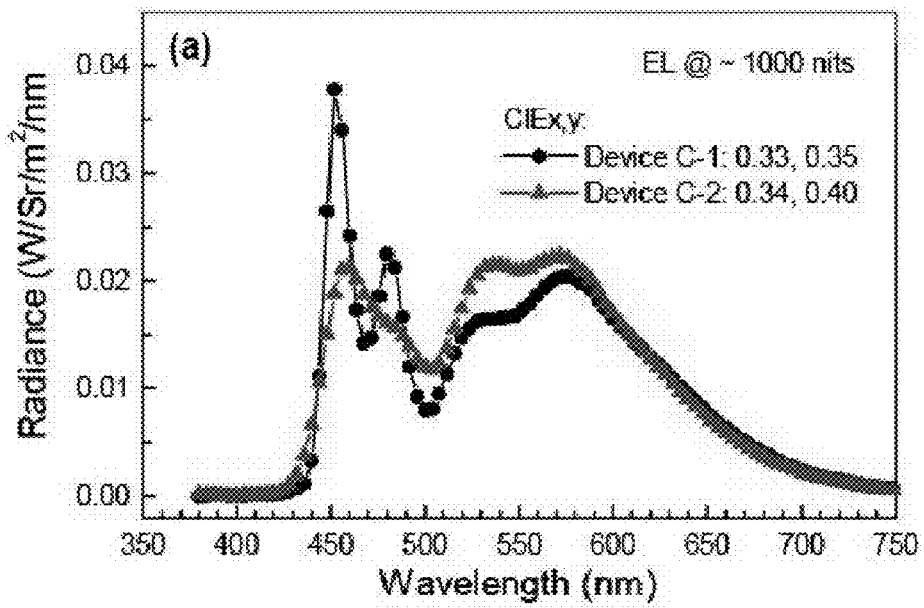
FIG. 7 illustrates a graph showing light emitting characteristics of phosphorescent light emitting layers having green and orange dopants added thereto respectively in a white organic light emitting device with two stacks.

FIG. 7 illustrates a graph showing light emitting characteristics of phosphorescent light emitting layers having green and orange dopants added thereto respectively in a white organic light emitting device with two stacks.

FIG. 7 illustrates a graph showing characteristics of a white organic light emitting device shown on page 818 Vol. 39 of SID journal in 2008, showing a case a first stack has a blue light emitting layer, and a second stack contains a host material and green and orange dopants, wherein a curve indicated with • marks shows an example in which a deep blue material is used in the first stack, and the other curve indicated with ▲ marks shows an example in which a light blue material is used in the first stack. It can be known that, when the deep blue material is used, the blue wavelength is more intensive than the other color wavelength. However, it can be known that a broad light emission takes place in each wavelength band regardless of use of blue light emitting materials that have a certain level of light emission in the first stack, and the light emitting efficiency is poor in a red wavelengths of 610 nm~700 nm. That is, it can be known that when a color filter is applied to the white organic light emitting device, a color reproduction ratio is significantly poor in the red wavelengths, and sensitivities of the R, G, B colors are poor since it appears that the red, green, and blue wavelengths do show peaks distinctively.

Since it is understood that the problem in a structure of FIG. 7 lies on using the green and orange dopants in the second stack, in the present invention, the orange dopant in the second stack is substituted with a red dopant.

Figure 8:
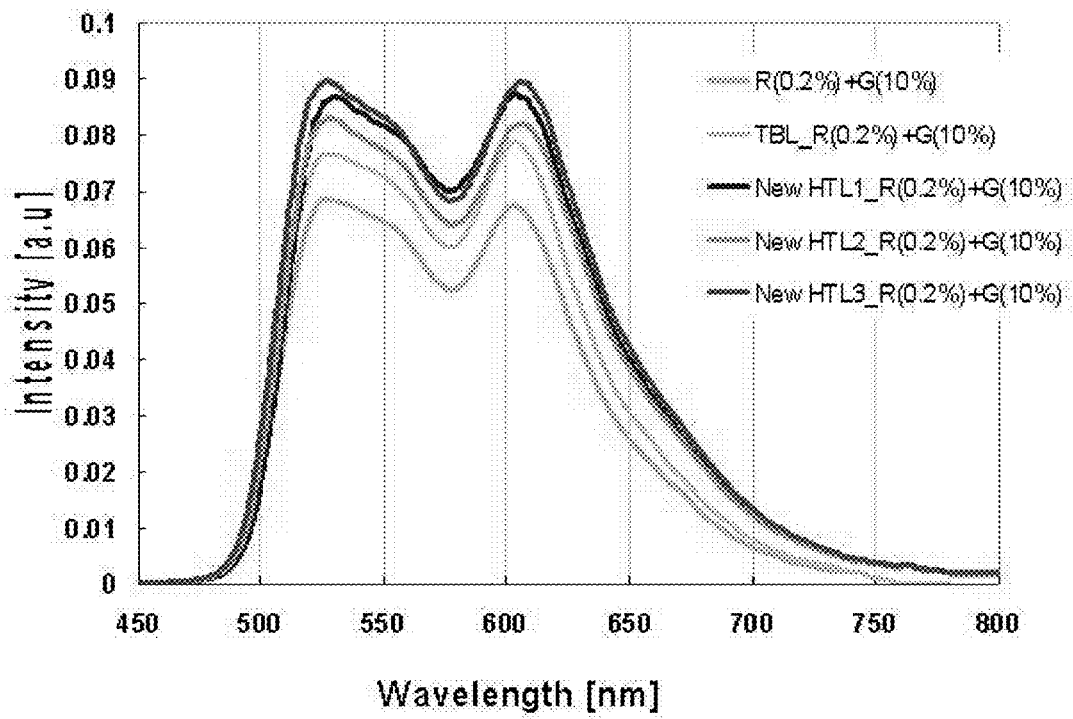
FIG. 8 illustrates a graph showing brightness characteristics in a case a hole transport layer has a low energy level, in a case an exciton blocking layer is provided, and in a case the hole transport layer has an energy level higher than an energy level when a triplet of a phosphorescent light emitting layer is excited, when green or red dopant is added to a second light emitting layer in a second stack of a white organic light emitting device.

FIG. 8 illustrates a graph showing brightness characteristics in a case a hole transport layer has a low energy level, in a case an exciton blocking layer is provided, and in a case the hole transport layer has an energy level higher than an energy level when a triplet of a phosphorescent light emitting layer is excited, when green or red dopant is added to a second light emitting layer in a second stack of a white organic light emitting device.

FIG. 8 illustrates test examples with the second light emitting layers formed of a host material, and the host material added with 0.2% of red dopant and 10% of green dopant, respectively. That is, starting from a curve on a lowest side to upward in succession, curves in FIG. 8 illustrates three cases of a case the energy level of the second hole transport layer adjacent to the second light emitting layer is set similar to the excited state energy level of the second light emitting layer, a case a triplet blocking layer is added to an interface of the second light emitting layer and the second hole transport layer, and a case a material of the second hole transport layer is changed to make the energy level of the second hole transport layer is higher than the excited state energy level of the second light emitting layer.

Referring to FIG. 8 and table 4 below, it can be noticed that, if a general hole transport layer is provided, though the driving voltage is 3.4V which is not high significantly, a light emitting quantity is 39.9 Cd/A, 36.8 lm/W, 3988 Cd/m2 and light emitting efficiency is 16.0% which is low.

If a triplet blocking layer is added to an interface of general hole transport layer and a light emitting layer, in comparison to the foregoing case, though the light emitting quantity is 45.5 Cd/A, 39.7 μm/W, 4550 Cd/m2 and light emitting efficiency is 1840% which show a rise, as the driving voltage rises to 3.6V, it can be expected that a power consumption increases.

Opposite to this, in a case a second hole transport layer is provided, which has an energy level 0.01~0.4 eV higher than the excited state energy level of the second light emitting layer of the white organic light emitting device of the present invention, the driving voltages are 3.2V, 3.3V and 3.0V, all of which are lower than above two cases, and the light emitting efficiencies are 20.6%, 19.6%, 21.3%, all of which are higher.

In all of the cases, the CIE coordinate systems show coordinates similar to one another.

TABLE 4

| Structure | Volt (V) | Cd/A | lm/W | QE(%) | Cd/m2 | CIEx | CIEy |
|---|---|---|---|---|---|---|---|
| G(10%) + R(0.2%) | 3.4 | 39.9 | 36.8 | 16.0% | 3988 | 0.445 | 0.532 |
| TBL_G(10%) + R(0.2%) | 3.6 | 45.5 | 39.7 | 18.4% | 4550 | 0.449 | 0.529 |
| New HTL1_G(10%) + R(0.2%) | 3.2 | 51.0 | 50.0 | 20.6% | 5100 | 0.454 | 0.524 |
| New HTL2_G(10%) + R(0.2%) | 3.3 | 48.5 | 46.2 | 19.6% | 4851 | 0.448 | 0.525 |
| New HTL3_G(10%) + R(0.2%) | 3.0 | 52.5 | 55.0 | 21.3% | 5251 | 0.449 | 0.524 |

Figure 9:
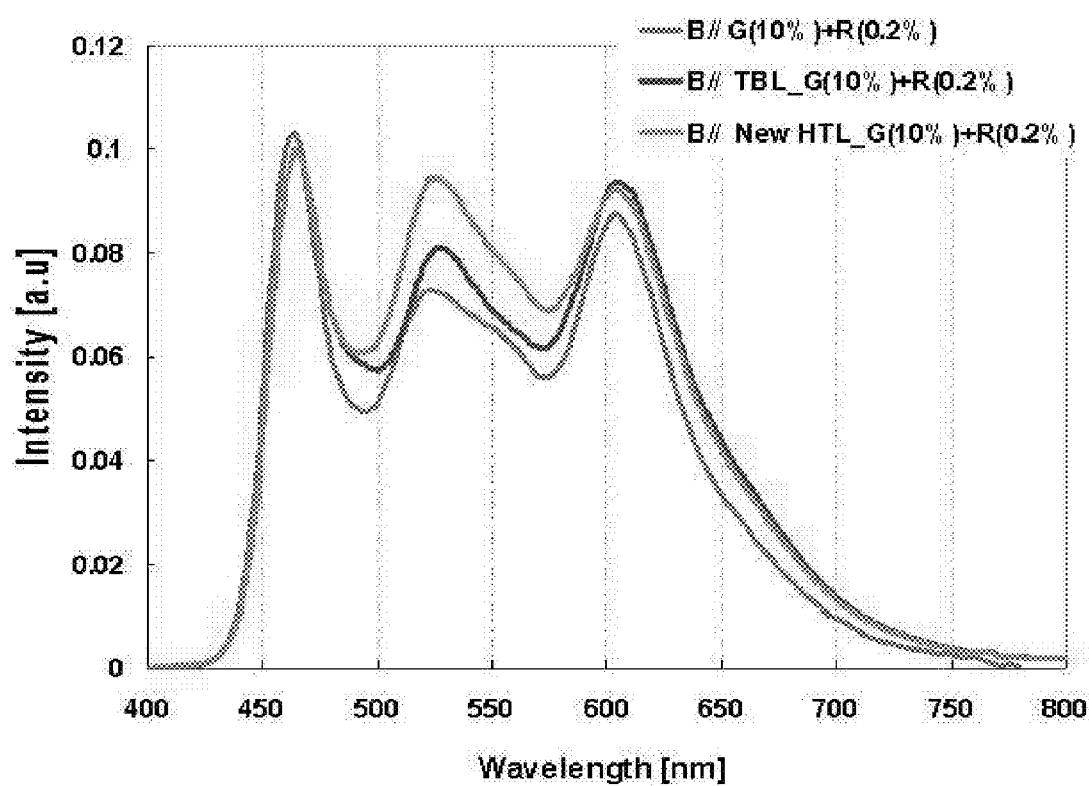
FIG. 9 illustrates a graph showing brightness characteristics vs. wavelengths in a case a hole transport layer in a second transport layer has a different energy level or an exciton blocking layer is provided at an interface with a phosphorescent light emitting layer when first and second stacks are provided to a white organic light emitting device.

FIG. 9 illustrates a graph showing brightness characteristics vs. wavelengths in a case a hole transport layer in a second transport layer has a different energy level or an exciton blocking layer is provided at an interface with a phosphorescent light emitting layer when the first and second stacks are provided to a white organic light emitting device.

FIG. 9 illustrates intensities of wavelengths when the first and second stacks are provided to a white organic light emitting device, showing states in which a blue light emitting layer is added to the first stack in above three cases described with reference to FIG. 8, i.e., the case the energy level of the second hole transport layer adjacent to the second light emitting layer is set similar to the excited state energy level of the second light emitting layer, the case a triplet blocking layer is added to an interface of the second light emitting layer and the second hole transport layer, and the case a material of the second hole transport layer is changed to make the energy level of the second hole transport layer is higher than the excited state energy level of the second light emitting layer.

Referring to FIG. 9, in a case there are the first and second stacks like the white organic light emitting device of the present invention and the energy level of the second hole transport layer is made higher than the excited energy level of the second light emitting layer, it can be noted that the blue, green and red wavelengths have uniform intensities respectively, peak values which show the colors clearly, and similar peak values.

Referring to table 5 below, it can also be noted that the white organic light emitting device of the present invention has the driving voltage (6.4V) lower than other structures and the light emitting efficiency is improved to 29.3% on the contrary. In this case, it can be known that the light emission intensity is 57 cd/A, 28.0 lm/W, w797 Cd/m2. And, in the CIE coordinate system, CIEx is 0.366, and CIEy is 0.402.

Thus, the white organic light emitting device of the present invention is suitable for producing a white color as the host of the second light emitting layer is selected from materials having a high energy transfer ratio to the green dopant, and the red dopant is selected from materials having a high energy transfer ratio from the green dopant and a lifetime similar to the green dopant, so that a brightness is reduced to the same level in all wavelengths without color variation even if time passes by. That is, dopants having lifetimes of the dopants that emit color lights respectively are similar are used, so that only an overall intensity of the light is reduced even if time passes, enabling to sense a white color as each of wavelengths are reduced to the same level, thereby preventing the color shift from taking place, which has taken place at the related art two stacked white organic light emitting device.

As has been described, the white organic light emitting device and a method for manufacturing the same of the present invention have the following advantages.

In the white organic light emitting device having two stacks each having a blue light emitting layer and a mixed light emitting layer of green and red colors formed between the anode and the cathode, an energy level of the hole transport layer adjacent to the mixed light emitting layer of green and red color is set 0.01~0.4 eV higher than an excited state energy level, for preventing the excited state exciton from introducing to the hole transport layer. According to this, the hole transport layer performs a hole transport function as well as an exciton (singlet, and triplet) blocking layer, dispensing with an exciton blocking layer, the white organic light emitting device does not increase process steps and can reduce power consumption. Along with this, since portions of the singlet exciton and the triplet exciton remained in the light emitting layer are used in the light emission continuously, the light emission efficiency can be improved.

TABLE 5

| Structure | Volt (V) | Cd/A | lm/W | QE(%) | Cd/m2 | CIEx | CIEy |
|---|---|---|---|---|---|---|---|
| Bff G(10%) + R(0.2%) | 7.0 | 47.8 | 21.4 | 24.6% | 4776 | 0.352 | 0.375 |
| Bff TBL_G(10%) + R(0.2%) | 7.2 | 52 | 22.7 | 26.8% | 2268 | 0.363 | 0.386 |
| Bff New HTL_G(10%) + R(0.2%) | 6.4 | 57 | 28.0 | 29.3% | 2797 | 0.356 | 0.402 |

Figure 10:
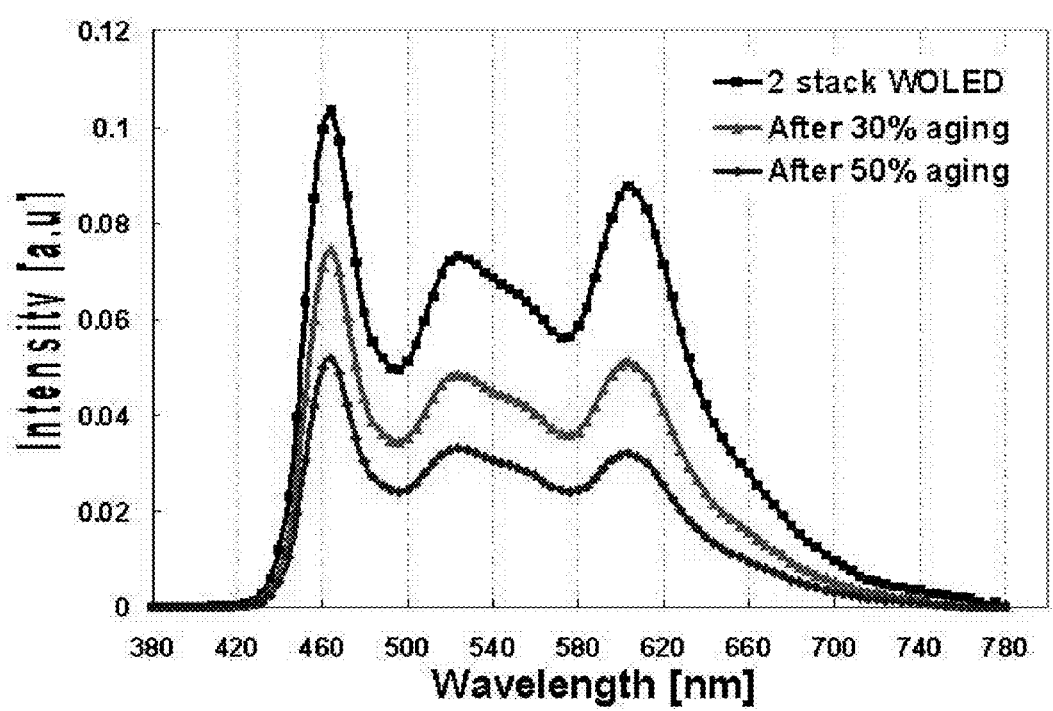
FIG. 10 illustrates a graph showing brightness vs. wavelengths of a white organic light emitting device in accordance with a present invention, varied with ages.

FIG. 10 illustrates a graph showing brightness vs. wavelengths of a white organic light emitting device in accordance with a present invention, varied with aging.

FIG. 10 illustrates, starting from an upper side to a lower side in succession in a white organic light emitting device, a case of an initial state intensities for each wavelengths, a case aging is around 30%, and a case the aging is around 50%.

Referring to FIG. 10 and table 6 below, the initial state, 30% aging and 50% aging show that the intensity is not reduced significantly in a particular color, but the intensities are reduced gradually in a uniform level in each of colors. This implies that the intensity is reduced on the whole even if time passes by. For an example, if the red color wavelength only ages significantly, if it is intended to produce a white color light, light emitting effects of the lights except the red color light, i.e., the green color light and the blue color light will be distinctive, showing a color shift.

Along with this, in producing the white color, by forming one stack as a light emitting layer containing a blue dopant and the other stack to have a host material containing appropriate amount of green and red dopants, enabling to show uniform peak values and distinctive peaks in each of red, green, and blue wavelength regions, a color reproducing ratio can be improved when a color filter is applied.

The use of dopants having similar lifetimes in using different color dopants permits to prevent an intensity of a wavelength of a certain color light from becoming poor, to prevent color shift.

It will be apparent to those skilled in the art that various modifications and variations can be made in the present invention without departing from the spirit or scope of the inventions. Thus, it is intended that the present invention

TABLE 6

| Structure | Volt (V) | Cd/A | lm/W | QE(%) | Cd/m2 | CIEx | ΔCIEx | CIEy | ΔCIEy | CIEu' | Δu' | CIEy' | Δy' |
|---|---|---|---|---|---|---|---|---|---|---|---|---|---|
| 2 stack WOLED | 7.0 | 47.8 | 21.4 | 24.5% | 4776 | 0.352 | | 0.375 | | 0.207 | | 0.496 | |
| After $L_{78}$ | 7.5 | 30.5 | 12.7 | 15.5% | 3050 | 0.336 | −0.017 | 0.370 | −0.006 | 0.198 | −0.009 | 0.492 | −0.004 |
| After $L_{58}$ | 7.8 | 23.1 | 9.3 | 12.2% | 2310 | 0.326 | −0.027 | 0.367 | −0.008 | 0.193 | −0.014 | 0.489 | −0.007 |

What is claimed is:

1. A white organic light emitting device comprising:
an anode and a cathode placed on a substrate opposite to each other;
a charge generation layer formed between the anode and the cathode;
a first stack of a first hole transport layer, a first light emitting layer for emitting a blue light, and a first electron transport layer between the anode and the charge generation layer; and
a second stack of a second hole transport layer, a second light emitting layer having a host doped with phosphorescence red and green dopants together, and a second electron transport layer between the charge generation layer and the cathode, wherein the second hole transport layer has an energy level set higher than a triplet excited state energy level of the second light emitting layer.

2. The device as claimed in claim 1, wherein the second transport layer has an energy level set 0.01~0.4 eV higher than the triplet excited state energy level of the second light emitting layer.

3. The device as claimed in claim 1, wherein the second hole transport layer is formed of a compound with a chemical formula 1 shown below having an asymmetric structure

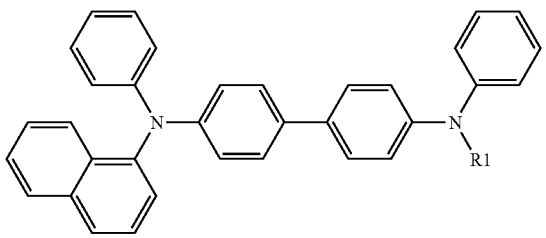

Chemical Formula 1

Wherein R1 is selected from a substituted or non-substituted aromatic group or a heterocyclic group.

4. The device as claimed in claim 3, wherein the R1 is be selected from one of a substituted or non-substituted phenyl, pyridine, naphthalene, quinoline and carbazole.

5. The device as claimed in claim 1, wherein the host of the second light emitting layer is selected from materials having a high energy transfer ratio to the green dopant, and the red dopant is selected from materials having a high energy transfer ratio from the green dopant and a lifetime similar to the green dopant.

* * * * *